(12) United States Patent
Kim et al.

(10) Patent No.: US 6,498,102 B2
(45) Date of Patent: Dec. 24, 2002

(54) METHOD FOR PLANARIZING A SEMICONDUCTOR DEVICE USING CERIA-BASED SLURRY

(75) Inventors: Jung-yup Kim, Seoul (KR); Young-rae Park, Suwon (KR); Sang-rok Hah, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/803,741

(22) Filed: Mar. 12, 2001

(65) Prior Publication Data

US 2001/0024879 A1 Sep. 27, 2001

(30) Foreign Application Priority Data

Mar. 13, 2000 (KR) .............................................. 00-12428

(51) Int. Cl.[7] .............................................. H01L 21/302
(52) U.S. Cl. ....................................... 438/691; 438/692
(58) Field of Search ................................. 438/690, 691, 438/692, 693, 694, 698, 699

(56) References Cited

U.S. PATENT DOCUMENTS

| 4,939,105 | A | * | 7/1990 | Langley .............. 148/DIG. 131 |
| 5,145,554 | A | * | 9/1992 | Seki et al. .............. 204/192.34 |
| 5,494,854 | A | | 2/1996 | Jain ............................ 438/633 |
| 5,789,360 | A | * | 8/1998 | Song et al. ..................... 134/3 |
| 5,893,750 | A | | 4/1999 | Hause et al. ................. 438/633 |
| 5,916,819 | A | * | 6/1999 | Skrovan et al. ................ 216/89 |
| 6,326,270 | B1 | * | 12/2001 | Lee et al. .................... 438/279 |

* cited by examiner

*Primary Examiner*—Gregory Mills
*Assistant Examiner*—Kin-Chan Chen
(74) *Attorney, Agent, or Firm*—Volentine Francos, PLLC

(57) ABSTRACT

A chemical mechanical polishing (CMP) process employs a ceria-based slurry as an abrasive. In particular, a nitride pattern is formed over a semiconductor substrate, and an oxide layer is then formed over the semiconductor substrate and the nitride pattern. Next, a sacrificial insulation layer which is devoid of surface steps is formed over the oxide layer. The sacrificial insulation layer and the oxide layer are then polished by CMP using the ceria-based slurry and using the nitride pattern as a stopper.

16 Claims, 4 Drawing Sheets

METHOD FOR PLANARIZING A SEMICONDUCTOR DEVICE USING CERIA-BASED SLURRY

BACKGROUND OF THE INVENTION

1. Field of the Invention

The present invention generally relates to the manufacture of semiconductor devices, and more particularly, the present invention relates to the planarization of the surface of an insulation layer by chemical mechanical polishing (CMP) using a ceria-based slurry.

2. Description of the Related Art

As the degree of integration of microelectronic devices continues to increase, planarization processes used in the fabrication of such devices become more and more critical. That is, efforts to achieve highly integrated semiconductor devices are typically attended by the stacking of multiple interconnection and other layers on a semiconductor wafer. The resultant unevenness of the wafer surface presents a variety of problems which are well-documented in the art. Planarization processes are thus adopted at various stages of fabrication in an effort to minimize irregularities in the wafer surface.

One such planarization technique is chemical/mechanical polishing (CMP). In CMP, the wafer surface is pressed against a polishing pad in relative rotation. During polishing, an abrasive and chemically reactive solution known as a CMP slurry is made to flow into the polishing pad. This CMP technique planarizes the wafer surface by means of chemical and physical reactions, that is, by supplying the chemically reactive slurry as a thin film on a patterned surface of the wafer while at the same time physically pressing the relative rotating surface of the polishing pad against the surface of the wafer.

One common application of CMP is in shallow trench isolation (STI). In STI techniques, relatively shallow isolation trenches are formed which function as field regions used to separate active regions on a wafer. In this process, a nitride (SiN) stop layer is deposited over on a semiconductor substrate. The nitride stop layer is then patterned and etched to form trenches which extend through the nitride stop layer and into the semiconductor substrate. Thereafter, an insulating oxide layer (which will ultimately forms the trench oxide regions) is deposited so as to fill the trenches and cover the surface of the nitride stop layer. The oxide layer is then subjected to CMP so as to remove the oxide layer down to the level of the nitride stop layer. In particular, during the CMP process, the oxide layer is removed until the upper surface of the nitride stop layer is exposed. Due to differing chemical and physical characteristics thereof, the oxide and nitride layers exhibit different removal rates when subjected to CMP using known slurries. The ratio of these removal rates at least partially defines the "selectivity" of the slurry being used. The lower the selectivity of the slurry, the more nitride that will be polished away during the CMP process.

Recently, ceria-based slurries (hereinafter, referred to as "ceria slurries") have been introduced which contain cerium oxide particles and which provide suitable abrasive characteristics for insulation layers containing $SiO_2$ as a major component. These ceria slurries have a relatively high oxide-to-nitride selectivity of about 45:1. In contrast, commonly used silica-based slurries (hereinafter, referred to as "silica slurries") have oxide-to-nitride selectivities of about 4:1. As such, the stopper function of the nitride stop layer is more effective using ceria slurries. Further, variations in the thickness of the nitride layer after CMP processing are minimized.

One drawback of ceria slurries, however, resides in fact that the oxide removal rate thereof drops sharply in the case where the oxide surface being polished is uneven and/or contains pattern steps. In contrast, the oxide removal rate of silica slurries is not dependent on whether the oxide surface being polished is uneven and/or contains pattern steps.

Two examples in which the oxide surface being polished is uneven or contains pattern steps are described below with reference to FIG. 1 and FIG. 2, which are sectional views for use in explaining conventional trench refill processes in the manufacture of semiconductor devices at a comparatively small design rule.

In FIG. 1, a nitride pattern 12 having a predetermined surface configuration is formed over a semiconductor substrate 10. Exposed portions of the semiconductor substrate 10 are then etched to a predetermined depth to form a plurality of trenches. These trenches are then filled with a material which is highly flowable and thus exhibits a favorable filling property, such as a high density plasma oxide (HDP) material, thereby resulting in a first oxide layer 22. The favorable filling property of the material ensures sufficient step coverage (without voids) even for trenches having high aspect ratios which are typically resident in a cell array region. Further, as shown in FIG. 1, the HDP material is also deposited on the nitride layer 12 between the trenches. These portions of the first oxide layer 22 are shown in FIG. 1 as having triangular cross-sections. Then, a conformable material which forms a second oxide layer 24 is deposited to a uniform thickness over the first oxide layer 22. Examples of the material of the second oxide layer 24 include borophosphosilicate glass (BPSG), undoped silicate glass (USG), and plasma-enhanced tetraethylorthosilicate (TEOS). The cross-sectional profile of the first oxide layer 22 is reflected in the surface configuration of the second oxide layer 24. That is, as shown in FIG. 1, local steps A are formed in the surface of the second oxide layer 24. In addition, local steps B are formed between the cell array region having relatively narrow trenches and a peripheral circuit region having relatively wide trenches.

The configuration of FIG. 2 differs from that of FIG. 1 in that a single oxide layer 24 is deposited in the configuration of FIG. 2 (i.e., the deposition of a highly flowable layer 22 of FIG. 1 is omitted). As shown, even in the absence of the initial deposition of the layer 22, the underlying trenches of the cell array region create local steps C in the surface of the second oxide layer 24 (e.g., USG layer). Also, as shown, local steps similar to the steps B of FIG. 1 are formed between the cell array region having relatively narrow trenches and a peripheral circuit region having relatively wide trenches.

FIG. 3 is a graph which comparatively shows CMP performances of silica and ceria slurries in the polishing of the stepped-surface cell array region to reduce or eliminate the local steps B shown in FIG. 1. The results of FIG. 3 were measured with respect to a semiconductor substrate 10 in which an HDP first oxide layer 22 and a PE-TEOS second oxide layer 24 were deposited in sequence. In FIG. 3, the plot "a" for silica slurry shows an oxide removal rate of about 3000 Å/min in the cell array region. The same result is observed when the CMP is applied under the same conditions to an oxide layer which does not have a stepped surface. In contrast, the plot "b" for ceria slurry shows an oxide removal rate of about 160 Å/min in the cell array region. This oxide removal rate is very low when compared to the CMP performance of ceria slurry (about 3300 Å/min, not shown) when applied to a oxide layer which does not have surface steps. The sharp degradation of the oxide removal rate of the ceria slurry tends to occur where the oxide layer surface of the cell array region contains steps as shown in FIG. 1 and FIG. 2.

For these reasons, the conventional CMP process is carried out in two stages. In a first stage, the silica slurry is first utilized to polish the oxide layer since is has a high removal rate that is not degraded by the presence of steps in the oxide surface. Then, in a second stage, the ceria slurry is utilized to again polish the oxide layer since it exhibits a high oxide-to-nitride selectivity and thus enhances the stopper function of the nitride pattern. This need for two different process stages using two different slurries increases the overall complexity of the CMP process, thus increasing costs and lowering throughput.

SUMMARY OF THE INVENTION

It is an object of the present invention to provide an effective method for planarizing an oxide layer having local steps in a surface using a single stage chemical mechanical polishing (CMP) process.

To achieve the object of the present invention, there is provided a planarization method for a semiconductor device which a nitride pattern is formed over a semiconductor substrate, and an oxide layer is then formed over the semiconductor substrate and the nitride pattern. Next, a sacrificial insulation layer which is devoid of surface steps is formed over the oxide layer. The sacrificial insulation layer and the oxide layer are then polished by CMP using the ceria-based slurry and using the nitride pattern as a stopper.

The planarization method is effective to compensate a degradation in ceria slurry performance which would otherwise result from the presence of steps in the surface of the oxide layer. Such steps generally occur in cases where the oxide layer is used to fill trenches formed in an active region of the semiconductor substrate.

BRIEF DESCRIPTION OF THE DRAWINGS

The above object and advantages of the present invention will become more apparent from the detailed description that follows, with reference to the accompanying drawings, in which.

DETAILED DESCRIPTION OF THE INVENTION

Figure 1:
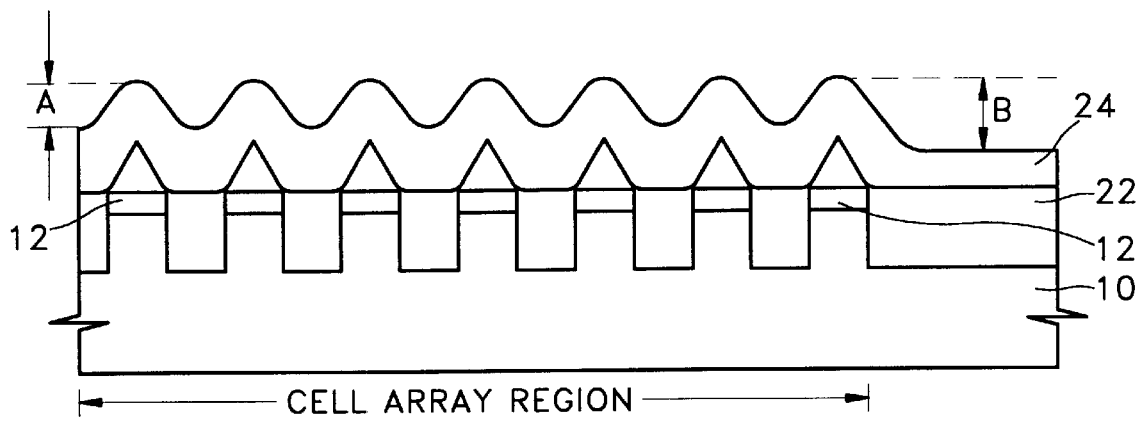
FIG. 1 is a sectional view illustrating a conventional planarization process for a semiconductor device.
Figure 2:
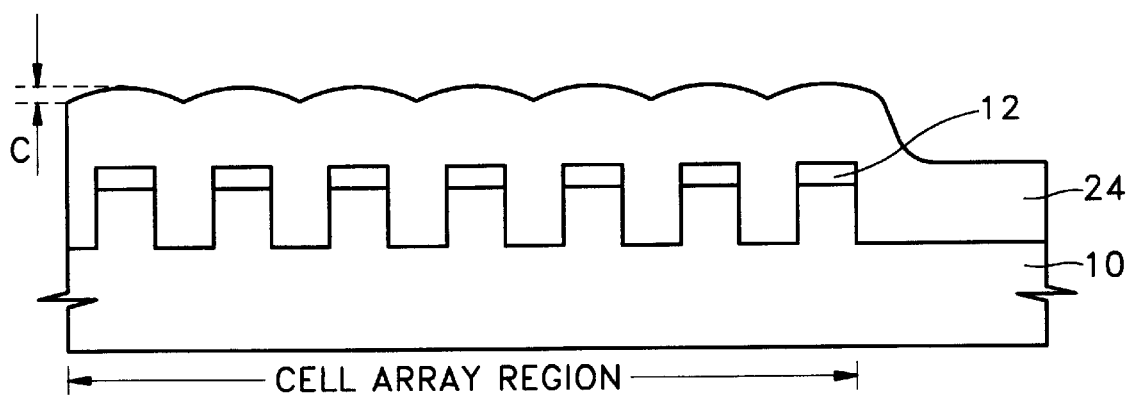
FIG. 2 is a sectional view illustrating another conventional planarization process for a semiconductor device.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. It is also noted that like reference numerals may be used to designate identical or corresponding parts throughout the drawings.

Figure 4A:
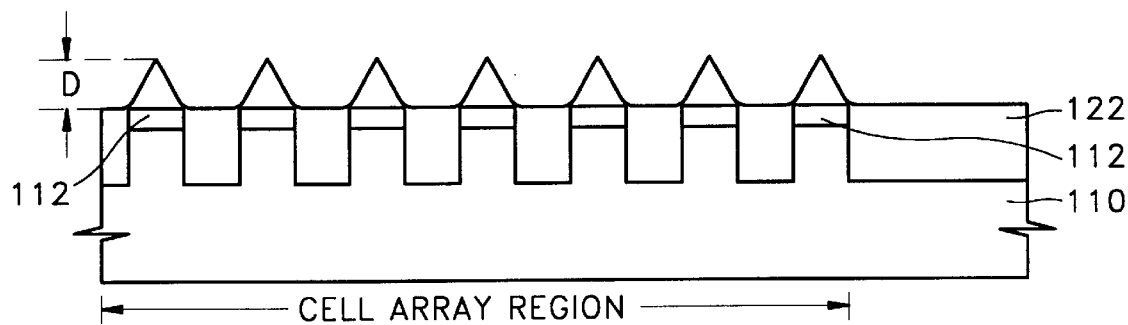
FIGS. 4A through 4C are sectional views illustrating a planarization method according to an embodiment of the present invention.
Figure 4B:
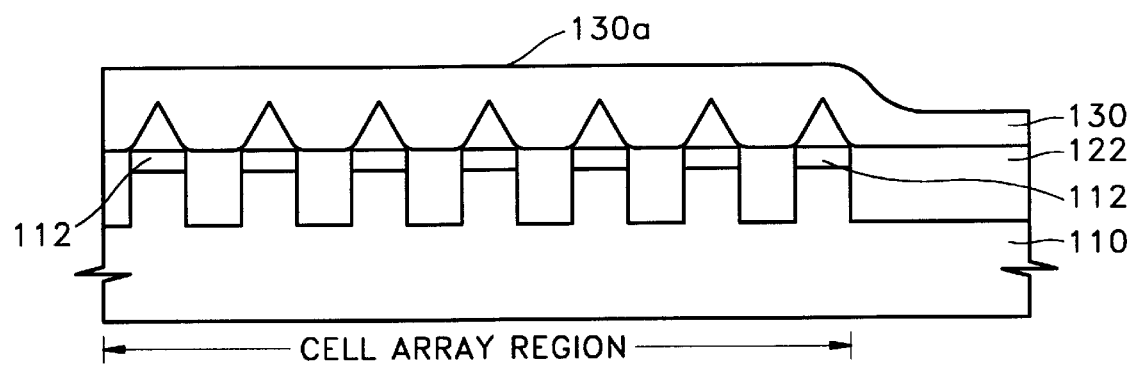
Figure 4C:
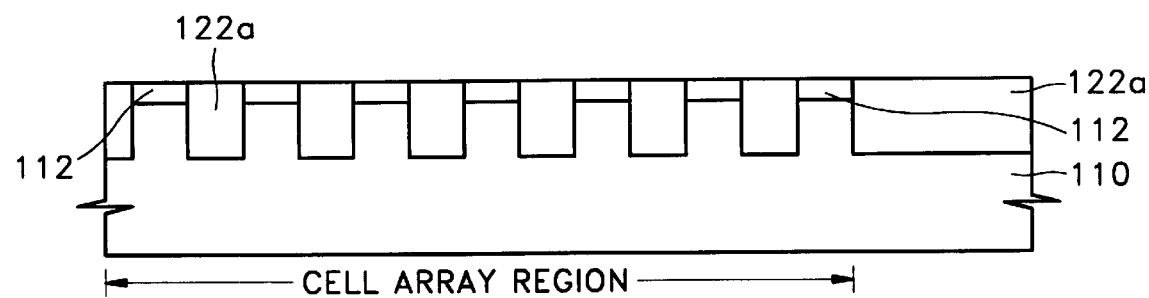

A preferred embodiment of a planarization method for a semiconductor device according to an embodiment of the present invention is illustrated in FIGS. 4A through 4C. Referring to FIG. 4A, a nitride pattern 112 having a predetermined surface configuration is formed over a semiconductor substrate 110. Exposed portions of the semiconductor substrate 110 are then etched to a predetermined depth to form a plurality of trenches. These trenches are then filled with a material which is highly flowable and thus exhibits a favorable filling property, such as a high density plasma oxide (HDP) material, thereby resulting in an oxide layer 122. The favorable filling property of the material ensures sufficient step coverage (without voids) even for trenches having high aspect ratios which are typically resident in a cell array region. Further, as shown in FIG. 4A, the oxide material is also deposited on the nitride layer 112 between the trenches. These portions of the oxide layer 122 are shown in FIG. 4A as steps D having triangular cross-sections.

Referring next to FIG. 4B, a sacrificial insulation layer 130 is formed over the oxide layer 122 so as to have a planar surface 130a. To obtain the planar surface, the sacrificial insulation layer 130 may be deposited as borophosphosilicate glass (BPSG) over the oxide layer 122, and then subjected to a reflow process to thereby eliminate any steps in the surface thereof. Alternatively, the sacrificial insulation layer 130 without surface steps can be formed by spin coating a photoresist material over the oxide layer 122. As another alternative in the formation of the sacrificial insulation layer 130, deposition of an oxide layer material having good filling property, such as an HDP oxide layer material, can be allowed to continue over the oxide layer 122 until a relatively large thickness thereof is sufficient to form a planar surface without local steps. In addition, it should be appreciated that other alternative techniques and/or materials for achieving an oxide layer having a planar surface may be adopted.

The planar surface 130a of the sacrificial insulation layer 130 is then polished with a ceria slurry (having a high oxide-to-nitride selectivity) using a single stage CMP process. Since the CMP process is applied to a planar surface which is devoid of local steps, a high oxide removal rate of the ceria slurry can be maintained throughout the CMP process. As shown in FIG. 4C, the CMP using the ceria slurry is continued until the nitride pattern 112 is exposed, thereby resulting in a planarized oxide layer 122a within the trenches.

Figure 5:
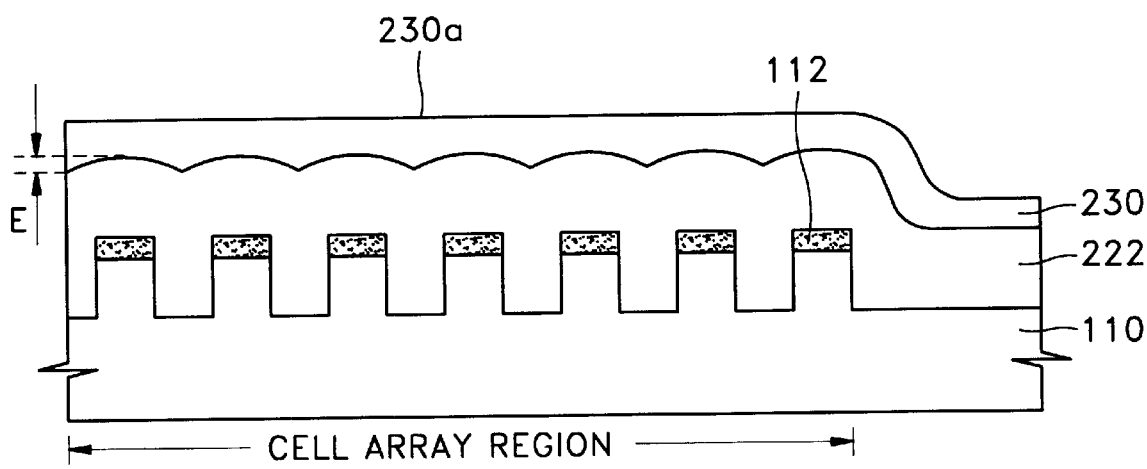
FIG. 5 is a sectional view illustrating a planarization method according to another embodiment of the present invention.

FIG. 5 illustrates an alternative embodiment in which an oxide layer 222 is first deposited within the trenches and over the nitride layer 112 as shown, whereby local steps E are formed in the surface of the oxide layer 222. Preferably, a material of the oxide layer 222 has a good conformal property, such as USG. Then, a sacrificial insulation layer 230 is deposited over the oxide layer 222 so as to have a planar surface 230a without local steps. The deposition techniques of the sacrificial insulation layer 230 can be the same as those discussed above in connection with FIGS. 4A through 4C. The planar surface 230*a* of the sacrificial insulation layer 230 is then polished with a ceria slurry (having a high oxide-to-nitride selectivity) using a single stage CMP process. Since the CMP process is applied to a planar surface which is devoid of local steps, a high oxide removal rate of the ceria slurry can be maintained throughout the CMP process.

The oxide layer being polished can each be formed as a single oxide layer such as an HDP oxide layer, a borophosphosilicate glass (BPSG) layer, an undoped silicate glass (USG) layer, or a plasma-enhanced tetraethylorthosilicate (PE-TEOS) layer, or as a multi-layer which combines two or more of these material layers. For example, the oxide layer can be formed as a single layer of HDP oxide. Alternatively, the oxide layer may include a first oxide layer formed of HDP oxide, and a second oxide layer formed over the first oxide layer of BPSG, USG or PE-TEOS. The oxide layer may also be formed as a single layer of BPSG, USG or PE-TEOS.

Figure 3:
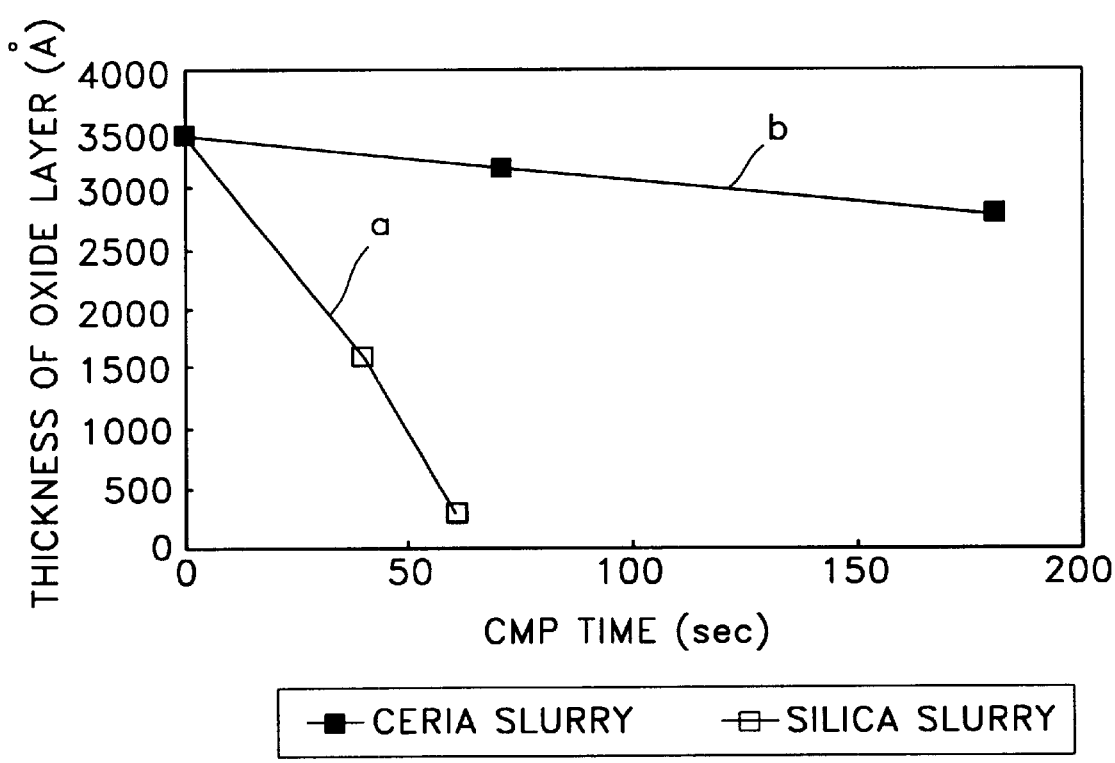
FIG. 3 is a graph which comparatively shows oxide removal rates of ceria and silica slurries in the conventional CMP process.
Figure 6:
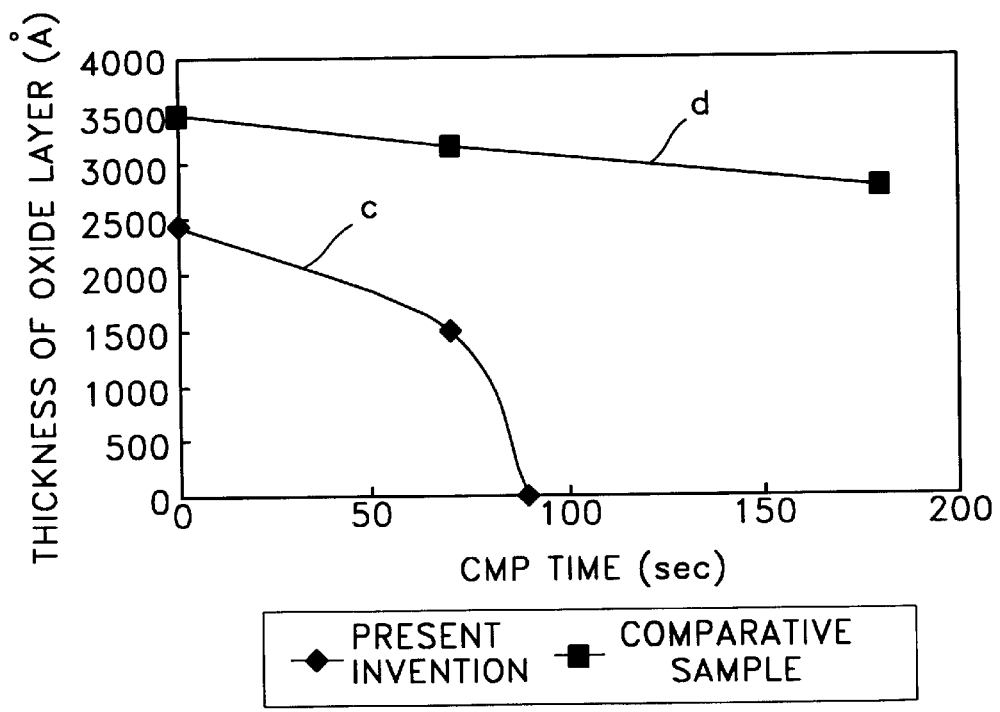
FIG. 6 is a graph illustrating the improvement in oxide removal rate using a ceria slurry in the planarization method of the present invention.

FIG. 6 is a graph illustrating the improvement in the oxide removal rate when using a ceria slurry in the planarization method according to an embodiment of the present invention. In FIG. 6, the plot "c" indicates the amount of removed oxide layer with respect to CMP time for a semiconductor substrate in which a HDP oxide layer, and a BPSG sacrificial insulation layer, were sequentially deposited over underlying nitride patterns, and where the BPSG layer was subjected to a reflow process to eliminate steps on the surface thereof. The plot "d" indicates the amount of removed oxide layer with respect to CMP time for the case where the ceria slurry is utilized for a conventional semiconductor substrate having oxide surface steps, and is the same as the plot "b" of FIG. 3.

As shown in FIG. 6, the oxide layer removal rate of the ceria slurry when adopting the technique of the present invention is substantially improved. As such, a single stage CMP process can be carried out in which ceria slurry (having a high oxide-to-nitride selectivity) can be used throughout the process. Thus, costs are reduced and throughput is enhanced when compared to the conventional two stage CMP process which uses both ceria and silica slurries.

While this invention has been particularly shown and described with reference to preferred embodiments thereof, it will be understood by those skilled in the art that various changes in form and details may be made to the described embodiments without departing from the spirit and scope of the invention as defined by the appended claims.

What is claimed is:

1. A planarization method for a semiconductor device, comprising:
   forming a nitride pattern over a semiconductor substrate;
   forming an oxide layer over the nitride pattern and the semiconductor substrate;
   forming a sacrificial insulation layer over the oxide layer, wherein the sacrificial insulation layer is formed such that an upper surface thereof which is opposite the oxide layer is devoid of local steps; and
   chemical mechanical polishing the sacrificial insulation layer and the oxide layer using a ceria-based slurry and using the nitride pattern as a stopper.

2. The planarization method of claim 1, wherein the oxide layer includes local steps on an upper surface.

3. The planarization method of claim 1, wherein a trench defined by the nitride pattern is formed in the semiconductor substrate, and wherein the trench is filled with the oxide layer.

4. The planarization method of claim 1, wherein the oxide layer is formed of at least one of a high density plasma oxide layer, a borophosphosilicate glass layer, an undoped silicate glass layer and a plasma-enhanced tetraethylorthosilicate layer.

5. The planarization method of claim 1, wherein the oxide layer is formed of a high density plasma oxide layer.

6. The planarization method of claim 1, wherein the oxide layer comprises a first oxide layer formed of a high density plasma oxide and a second oxide layer formed over the first oxide layer, wherein the second oxide layer is one of a borophosphosilicate glass layer, an undoped silicate glass layer and a plasma-enhanced tetraethylorthosilicate layer.

7. The planarization method of claim 1, wherein the oxide layer is one of a borophosphosilicate glass layer, an undoped silicate glass layer and a plasma-enhanced tetraethylorthosilicate layer.

8. The planarization method of claim 1, wherein forming the sacrificial insulation layer comprises:
   depositing an insulation material over the oxide layer; and
   subjecting the insulation material to a reflow process.

9. The planarization method of claim 8, wherein the insulation material is a borophosphosilicate glass.

10. The planarization method of claim 1, wherein forming the sacrificial insulation layer comprises spin coating an insulation material over the oxide layer.

11. The planarization method of claim 10, wherein the insulation material is a photoresist material.

12. A planarization method for a semiconductor device, comprising:
    forming an oxide layer within a plurality of trenches formed in an active region of the semiconductor substrate and over a nitride pattern located between the plurality of trenches, wherein an upper surface of the oxide layer which is opposite the substrate is formed so as to have a stepped configuration located over the active region;
    forming a sacrificial insulation layer over the oxide layer, wherein the sacrificial insulation layer is formed such that an upper surface thereof which is opposite the stepped configuration of the upper surface of the oxide layer is devoid of steps; and
    chemical mechanical polishing the sacrificial insulation layer and the oxide layer using a ceria-based slurry and using the nitride pattern as a stopper.

13. The planarization method of claim 12, wherein forming the sacrificial insulation layer comprises:
    depositing an insulation material over the oxide layer; and
    subjecting the insulation material to a reflow process.

14. The planarization method of claim 13, wherein the insulation material is a borophosphosilicate glass.

15. The planarization method of claim 12, wherein forming the sacrificial insulation layer comprises spin coating an insulation material over the oxide layer.

16. The planarization method of claim 15, wherein the insulation material is a photoresist material.

\* \* \* \* \*